United States Patent
Arnott (10) Patent No.: US 6,850,119 B2
(45) Date of Patent: Feb. 1, 2005

(54) POWER AMPLIFIER OVERLOAD PROTECTION

(75) Inventor: James Christopher Arnott, Greensboro, NC (US)

(73) Assignee: RF Micro Devices, Inc., Greensboro, NC (US)

(*) Notice: Subject to any disclaimer, the term of this patent is extended or adjusted under 35 U.S.C. 154(b) by 705 days.

(21) Appl. No.: 09/945,127

(22) Filed: Aug. 31, 2001

(65) Prior Publication Data

US 2003/0045251 A1 Mar. 6, 2003

(51) Int. Cl.$^7$ .............................. H03F 3/04; H03G 5/16
(52) U.S. Cl. .................... 330/298; 330/133; 330/207 P; 330/310
(58) Field of Search ............................ 330/133, 207 P, 330/298, 310

(56) References Cited

U.S. PATENT DOCUMENTS

| | | | |
|---|---|---|---|
| 3,852,669 A | 12/1974 | Bowman et al. ............ 325/151 |
| 4,547,746 A | 10/1985 | Erickson et al. ............ 330/298 |
| 4,647,871 A | 3/1987 | Turner, Jr. .................. 330/298 |
| 4,729,129 A | 3/1988 | Koerner ...................... 455/117 |
| 4,887,298 A | * 12/1989 | Haigler ........................ 381/55 |
| 5,003,271 A | 3/1991 | Swanson ..................... 330/298 |
| 5,070,309 A | 12/1991 | Swanson ..................... 330/298 |
| 5,196,808 A | 3/1993 | Pickett et al. ............... 330/298 |
| 5,220,290 A | * 6/1993 | Black ........................... 330/279 |
| 5,404,114 A | 4/1995 | Sager ..................... 330/207 P |
| 5,426,395 A | 6/1995 | Cygan .................... 330/207 P |
| 5,542,096 A | 7/1996 | Cygan et al. ............... 455/115 |
| 5,548,248 A | 8/1996 | Wang .......................... 330/288 |
| 5,590,415 A | 12/1996 | Peltola et al. ............... 455/115 |
| 5,913,154 A | 6/1999 | Wynn ......................... 455/127 |
| 6,124,758 A | 9/2000 | Korte et al. ............ 330/124 R |
| 6,137,366 A | 10/2000 | King .......................... 330/298 |
| 6,329,879 B1 | * 12/2001 | Maruyama et al. ......... 330/289 |
| 6,472,937 B1 | * 10/2002 | Gerard et al. ............... 330/133 |

* cited by examiner

Primary Examiner—Patricia Nguyen
(74) Attorney, Agent, or Firm—Withrow & Terranova, PLLC (57) ABSTRACT

The present invention relates to detecting overload conditions from within the bias circuitry for a multistage amplifier. Preferably, the overload condition is detected in the bias circuitry associated with the output stage of the amplifier. Upon detection of an overload, steps are taken to shunt the RF drive or reduce bias at one or more preceding stages of the amplifier to limit the excessive voltages or currents in the output stage.

24 Claims, 6 Drawing Sheets

POWER AMPLIFIER OVERLOAD PROTECTION

FIELD OF THE INVENTION

The present invention relates to power amplifier control, and in particular, to controlling power amplifiers to avoid or minimize overload conditions.

BACKGROUND OF THE INVENTION

Power amplifiers for wireless communication applications are often subjected to elevated voltages and extreme voltage standing wave ratio (VSWR) output loads. These power amplifiers are preferably constructed using an array of Gallium Arsenide or like heterojunction bipolar transistors (HBTs), which are known to break down under such elevated voltages and extreme VSWR loads. For example, the base collector breakdown voltage for a two micron HBT process is approximately 24 volts, wherein the collector emitter breakdown voltage is significantly less, at approximately 14 volts. Even when power supply voltages are significantly less than either of these breakdown voltages, leakage currents entering the base regions of the transistors experience beta multiplication if they are not provided with a good path to ground through the base contact.

Breakdown problems typically occur during portions of the radio frequency cycle just before and after transistor conduction. When the output device is not conducting and the collector current is close to zero, the collector voltage exhibits a "ringing" phenomenon similar to an under damped step response. The waveform for the collector voltage is influenced by a number of factors, such as: the matching network, the compression state of the amplifier, the amplifier bias, the low output impedance at the output of the amplifier, and the termination of any harmonics. The peak voltages at the collector will often exceed twice the power supply voltage under normal conditions even when the collector current is close to zero. Under extreme VSWR load conditions and at certain load reflection coefficient phase angles, the voltages can exceed three times the supply voltage, which may result in device failure.

Certain extreme VSWR load reflection coefficient phase angles produce very low impedances at the amplifier output. These low output load impedances produce large amplifier currents, which may lead to failure or output waveform distortion by spectral re-growth when operated in a pulsed mode. Amplifier failure occurs when an extreme VSWR load induces large amplifier current, which exceeds the safe-operating-region of the HBT devices. Amplifier distortion due to spectral re-growth in a pulsed application is caused by the inherent self-heating characteristic of HBT devices. The self-heating nature of the HBT devices creates a current gain reduction with increased DC power dissipation or device temperature. This self-heating induced current gain reduction creates a time variant HBT current gain function during pulsed operation. A time variant transfer function of the HBT devices modulates the input signal causing spectral spreading or re-growth centered on the amplified output RF signal.

A user simply touching the antenna of a mobile telephone may induce the output load mismatches that can lead to such conditions. Essentially, the act of touching the antenna changes the output load impedance for the device, which may lead to extreme VSWR conditions and excessive voltage peaks on the collectors of the output transistors. Given the relative ease in which such conditions are induced, there is a need for a way to protect the power amplifier circuitry from these conditions in an efficient and cost-effective manner.

SUMMARY OF THE INVENTION

The present invention relates to detecting overload conditions from within the bias circuitry for a multistage amplifier. Preferably, the overload condition is detected in the bias circuitry associated with the output stage of the amplifier. Upon detection of an overload, steps are taken to shunt the radio frequency (RF) drive or reduce bias at one or more preceding stages of the amplifier to limit the excessive voltages or currents in the output stage.

Accordingly, the present invention relates to amplifier and protection circuitry including an amplifier, bias circuitry, and threshold detection and limiting circuitry. The amplifier will have an output stage, an input stage, and perhaps intermediate stages for sequentially amplifying a radio frequency input signal to provide an output signal. The bias circuitry provides bias to at least the output stage, and optionally the input and intermediate stages. The threshold detection and limiting circuitry is adapted to detect an overload condition in the bias circuitry and provide an overload signal to reduce drive at the input stage to remove the overload at the output stage.

In one embodiment, the input stage includes at least one transistor receiving bias from the bias circuitry via at least one base resistor. Further, the threshold detection and limiting circuitry is coupled to the at least one base resistor opposite the transistor network so that bias provided through at least one base resistor creates a voltage detectable by the threshold detection and limiting circuitry. The threshold detection and limiting circuitry is typically adapted to detect an overload when the voltage exceeds a defined threshold voltage.

The threshold detection and limiting circuitry may include voltage divider circuitry cooperating with the resistor to set the defined threshold voltage and turn on an overload signal transistor to generate the overload signal. The voltage divider may include a series of diodes having a total forward bias threshold corresponding to the defined threshold voltage. The overload transistor may be coupled to the series of diodes and is adapted to turn on when current flows through the series of diodes during overload.

To reduce RF drive, the threshold detection and limiting circuitry may be coupled to the input stage to shunt away all or a portion of the bias for the input stage or the input signal. Alternatively, the threshold detection and limiting circuitry is responsive to the overload signal to reduce bias applied to the input stage, and optionally, the intermediate and output stages. In either case, optional signal conditioning circuitry may be used to condition the overload signal to facilitate drive reduction at the input stage to remove the overload at the output stage either directly or via control of the bias circuitry.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to detecting amplifier overload from within the bias circuitry for a multistage amplifier. Preferably, the overload is detected in the bias circuitry for the output stage of the amplifier. Upon detection of the overload, at least a portion of the radio frequency (RF) drive at one or more preceding stages of the amplifier is shunted or absorbed. Shunting the RF drive effectively limits the signal levels provided to subsequent stages, including the output stage, to remove the overload. Further details are provided following a description of a typical environment significantly benefiting from the invention.

Figure 1:
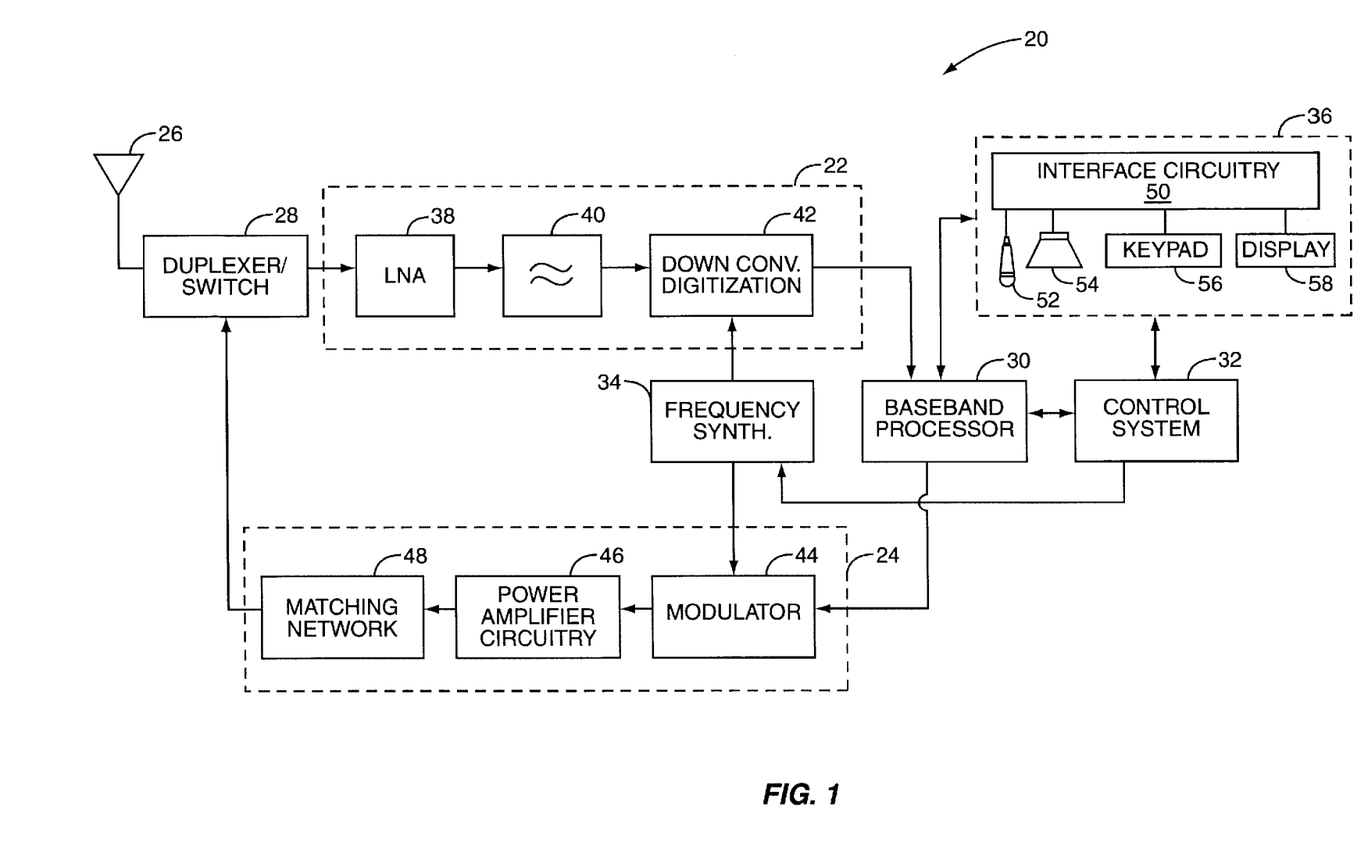
FIG. 1 is a schematic representation of a mobile terminal configured according to one embodiment of the present invention.

The present invention may be incorporated in a mobile terminal 20, such a mobile telephone, wireless personal digital assistant, or like communication device. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station. A low noise amplifier 38 amplifies the signal. A filter circuit 40 minimizes broadband interference in the received signal, while downconversion and digitization circuitry 42 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data, which may represent voice, data, or control information, from the control system 32, which it encodes for transmission. The encoded data is output to the transmitter 24, where it is used by a modulator 44 to modulate a carrier signal that is at a desired transmit frequency. Power amplifier circuitry 46 amplifies the modulated carrier signal to a level appropriate for transmission, and delivers the modulated carrier signal to antenna 26 through a matching network 48.

A user may interact with the mobile terminal 20 via the interface 36, which may include interface circuitry 50 associated with a microphone 52, a speaker 54, a keypad 56, and a display 58. The interface circuitry 50 typically includes analog-to-digital converters, digital-to-analog converters, amplifiers, and the like. Additionally, it may include a voice encoder/decoder, in which case it may communicate directly with the baseband processor 30.

The microphone 52 will typically convert audio input, such as the user's voice, into an electrical signal, which is then digitized and passed directly or indirectly to the baseband processor 30. Audio information encoded in the received signal is recovered by the baseband processor 30, and converted into an analog signal suitable for driving speaker 54 by the interface circuitry 50. The keypad 56 and display 58 enable the user to interact with the mobile terminal 20, input numbers to be dialed, address book information, or the like, as well as monitor call progress information.

As noted, the present invention relates to detecting amplifier overload from within the bias circuitry included in the power amplifier circuitry 46. When an overload condition is detected in the bias circuitry for the output stage of the amplifier, the RF drive at one or more preceding stages of the amplifier is shunted or otherwise absorbed. Shunting the RF drive effectively limits the current in the output stage. FIGS. 2–5 provide exemplary schematics highlighting numerous techniques for detecting overloads and suppressing the RF drive.

Figure 2:
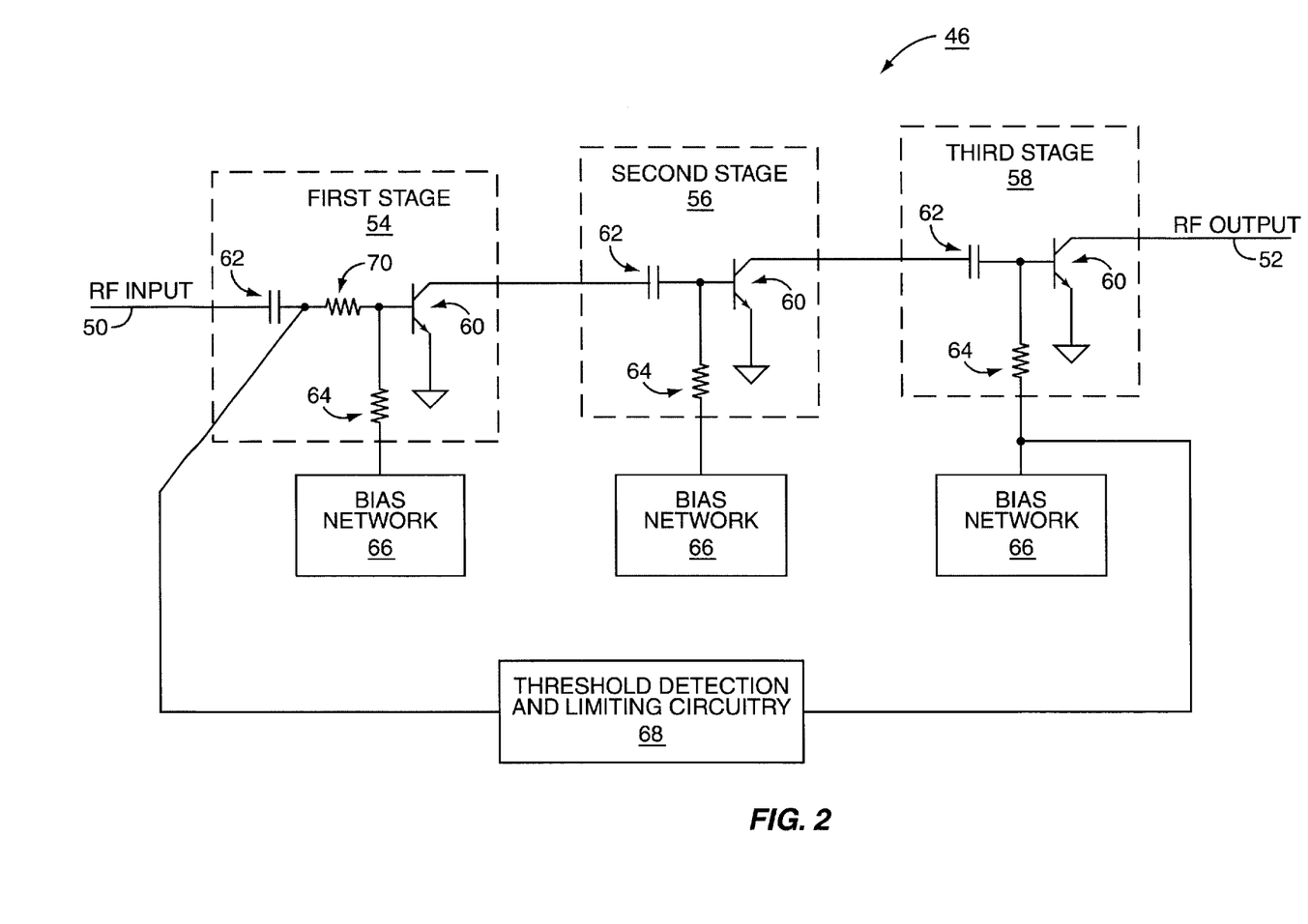
FIG. 2 is a schematic representation of an amplifier including threshold detection and limiting circuitry according to a first embodiment of the present invention.

With reference to FIG. 2, the amplifier circuitry 46 includes first, second and third amplifier stages 54, 56, and 58, which effectively amplify an RF input signal 50, to provide an RF output signal 52 for transmission. Each stage 54, 56, and 58 may include a transistor or transistor network 60, which will be referred to in general as a single transistor solely for the sake of conciseness and readability; an input capacitor 62; and a bias resistor 64. Similarly, the capacitors 62 and bias resistors 64 may take the form of a network instead of single device and be integrated into the transistor network, as well as include other components.

Preferably, at least the third stage 58 comprises a transistor network having a numerous parallel transistors 60, resistors 64, and capacitors 62 in the configuration depicted. Further information may be found in U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety.

Each of the first, second, and third stages 54, 56, and 58 requires bias. The bias may be provided by an integrated bias network or separate bias networks 66 associated with each stage 54, 56, and 58. Exemplary bias networks 66 capable of being used in association with the present invention are described in further detail in U.S. patent application Ser. No. 09/467,415, entitled BIAS NETWORK FOR HIGH EFFICIENCY RF LINEAR POWER AMPLIFIER, filed Dec. 20, 1999, currently pending, the disclosure of which is incorporated herein by reference in its entirety. Upon understanding the present invention, those skilled in the art will be able to construct any number of bias networks, which are compatible with the present invention.

FIG. 2 illustrates a first embodiment for detecting amplifier overload and shunting the RF drive, which may include the RF input signal 50 and bias, at one or more preceding stages of the amplifier circuitry 46. As illustrated, threshold detection and limiting circuitry 68 senses the relative bias required by the third stage 58 and operates to reduce the RF drive by partially shunting the RF input signal 50 to ground, preferably by an amount proportional to, and perhaps exceeding, the overload through resistor 70 Notably, the overload condition is sensed in the bias circuitry provided by the bias network 66 and resistor 64. Those skilled in the art will recognize that the threshold and detection circuitry 68 may be configured to sense a voltage or current. During normal operation, the threshold detection and limiting circuitry 68 is substantially dormant, wherein when the sensed voltage or current reaches a select threshold or changes by a defined amount, a portion of the RF input signal 50 and bias is shunted to ground through resistor 70 and corresponding switching circuitry provided by the threshold detection and limiting circuitry 68. By taking away available current to drive the base of the first stage transistor 60, the magnitude of the resulting signal provided to subsequent stages is reduced.

Figure 3:
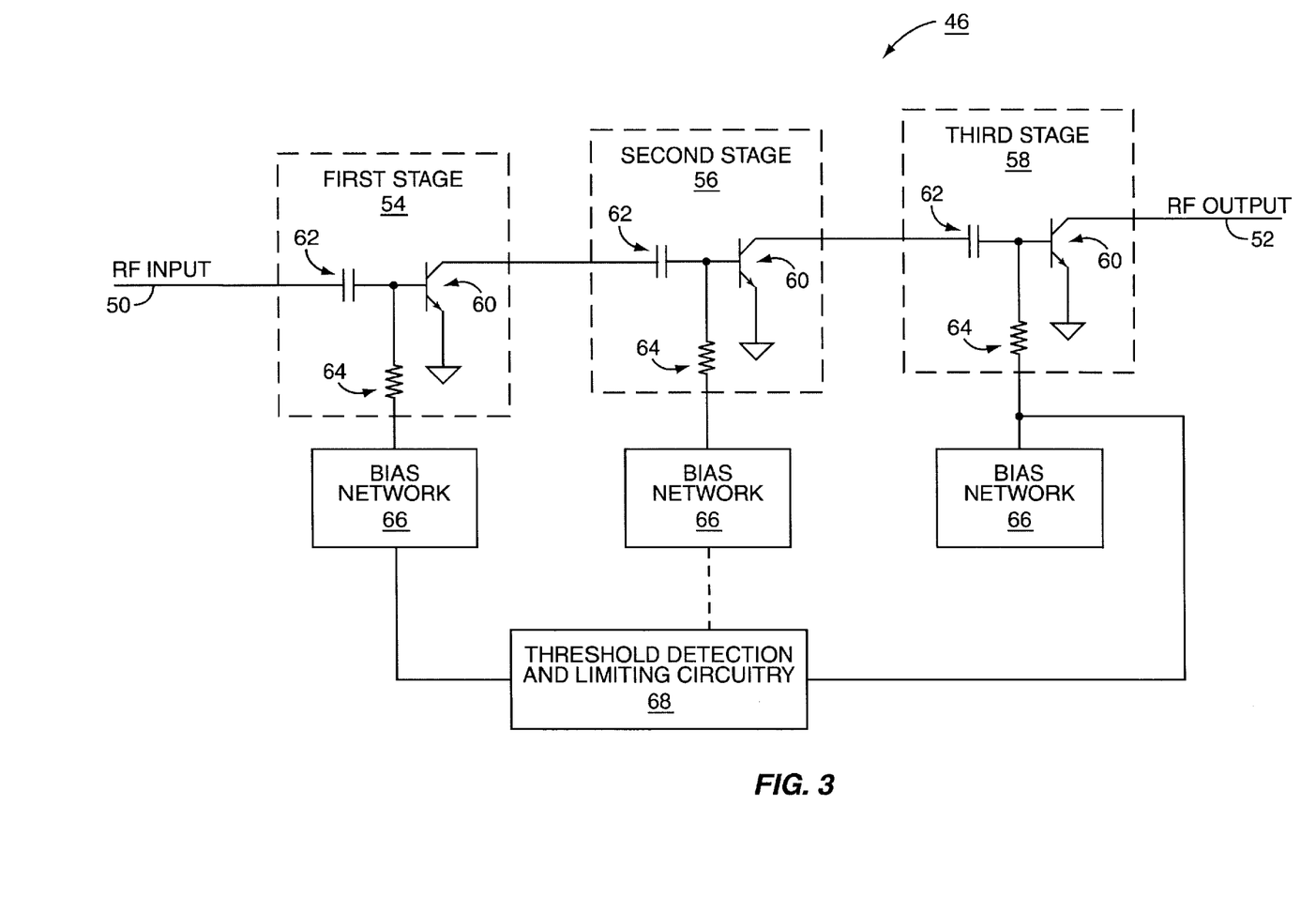
FIG. 3 is a schematic representation of an amplifier including threshold detection and limiting circuitry according to a second embodiment of the present invention.

FIG. 3 illustrates a second embodiment, which is similar to FIG. 2 with the exception that the threshold detection and limiting circuitry 68 generates a control signal for the bias network 66 associated with the first stage 54. In contrast to the first embodiment, which draws current away from the base of transistor 60 of the first stage 54 through resistor 70, the control signal may be used to further control the bias provided to the transistor 60 of the first stage 54. As such, when an overload condition is sensed at the bias network 66 for the third stage 58, the threshold detection and limiting circuitry 68 will provide a signal to the bias network 66 of the first stage 54. The bias network 66 for the first stage 54 and the threshold detection and limiting circuitry 68 may be configured in various ways to provide and process the control signal in a fashion to reduce the bias provided to transistor 60 of the first stage 54. As further illustrated in phantom in FIG. 3, the threshold detection and limiting circuitry may also provide the same or second control signal to the bias network 66 for the second stage 56 to modify the bias provided to transistor 60 during overload conditions.

Figure 4:
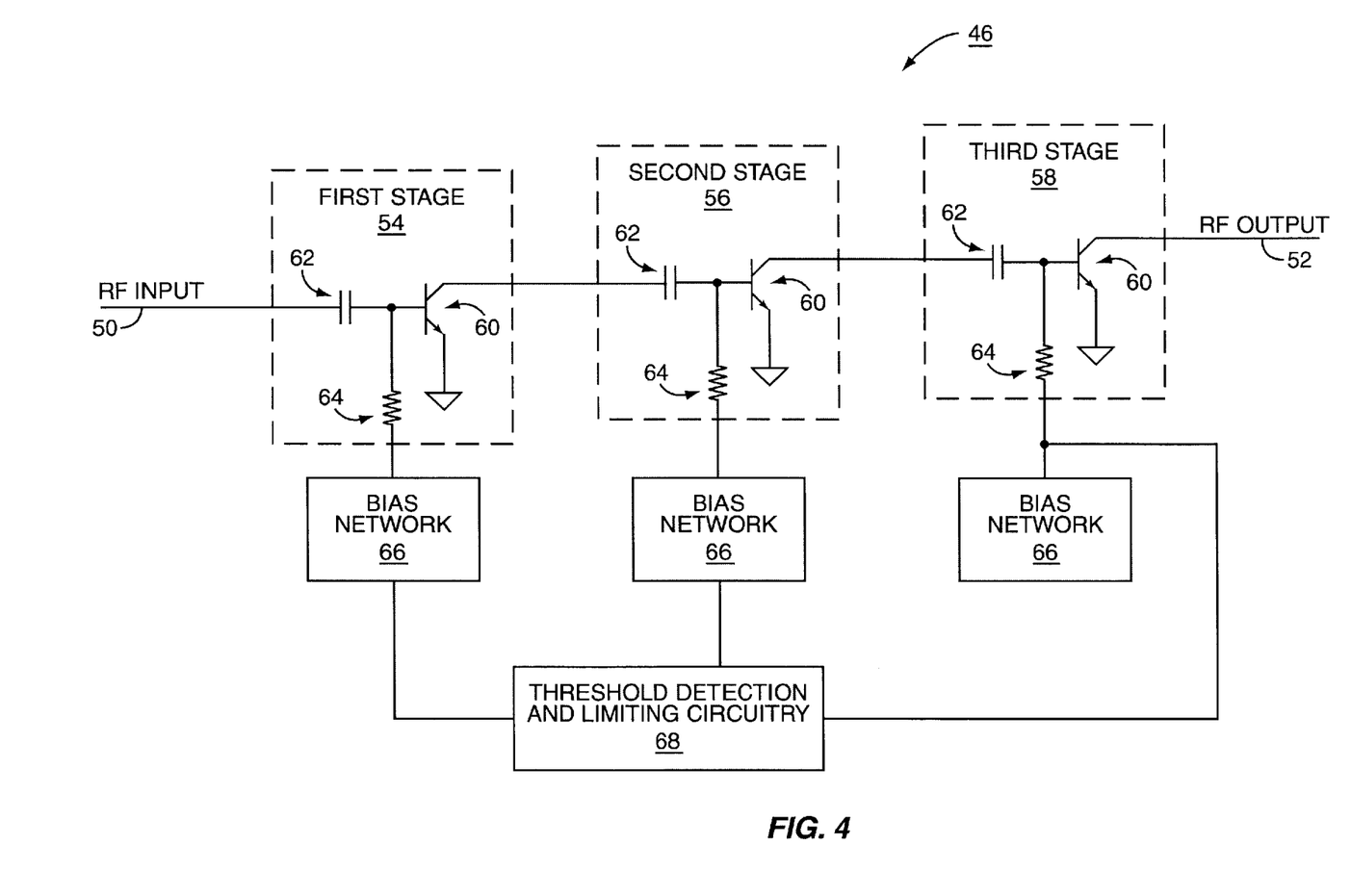
FIG. 4 is a schematic representation of an amplifier including threshold detection and limiting circuitry according to a third embodiment of the present invention.

FIG. 4 illustrates yet another embodiment wherein the threshold detection and limiting circuitry 68 generates a control signal or signals to the bias network 66 for each of the first, second, and third stages 54, 56, and 58. Notably, the signals may be unique or the same when separate bias networks are provided for each stage. Further, one signal may be used to control an integrated bias network providing bias for each of the stages. Importantly, the bias network(s) 66 operate to receive the control signal(s) from the threshold detection and limiting circuitry 68 and effectively reduce drive by reducing bias, signal shunting, reducing gain, or a combination thereof.

Figure 5:
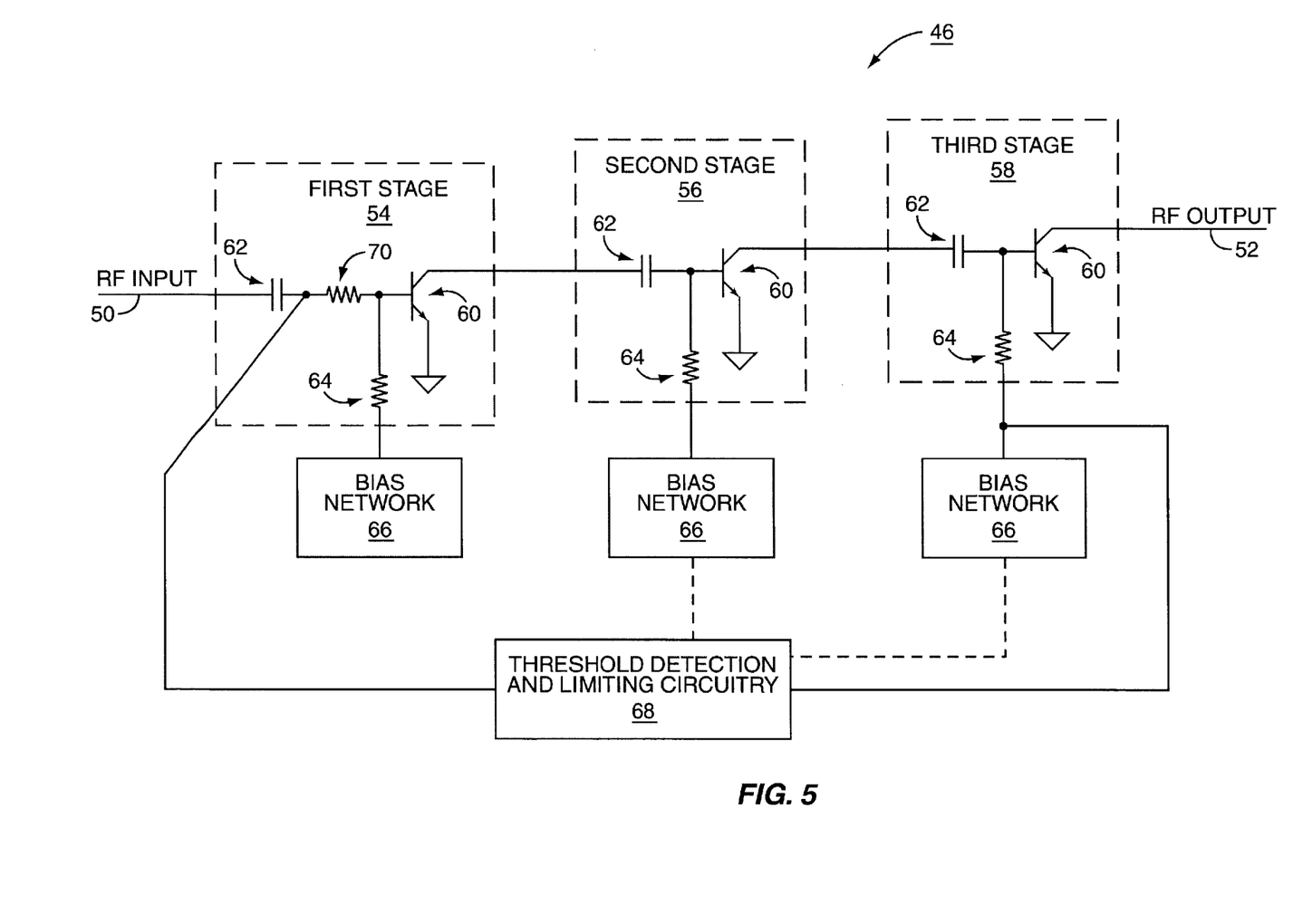
FIG. 5 is a schematic representation of an amplifier including threshold detection and limiting circuitry according to a fourth embodiment of the present invention.

Yet another example is illustrated in FIG. 5, which represents a combination of the earlier embodiments. The threshold detection and limiting circuitry 68 is adapted to shunt signals appearing at the base of transistor 60 in the first stage 54 through resistor 70 as well as control one or more of the bias networks 66. Further modifications would include a shunting arrangement for the second and third stages 56, 58, alone or in combination with one or more of the other techniques.

Figure 6:
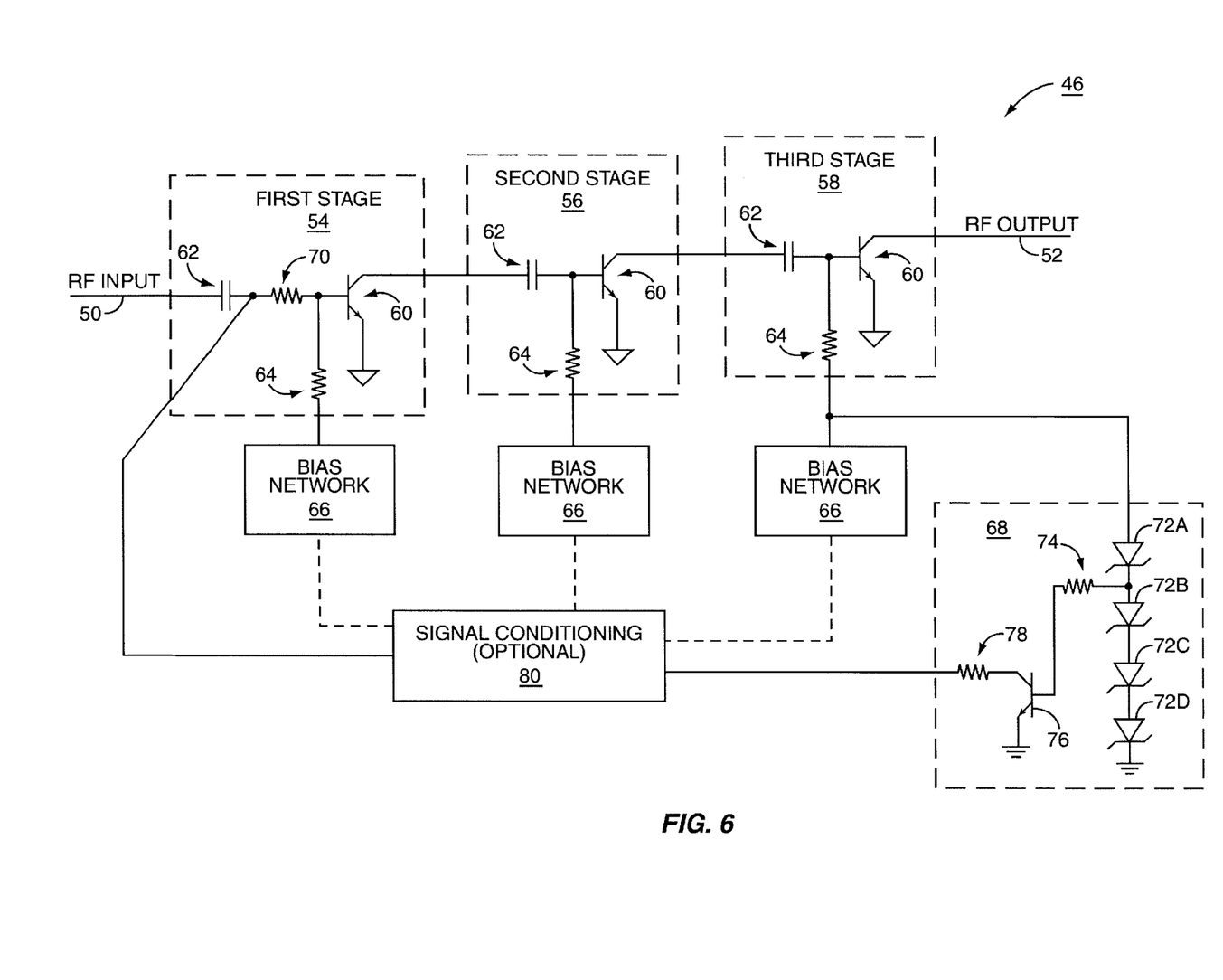
FIG. 6 is a schematic representation of an amplifier including detail for threshold detection and limiting circuitry according to a preferred embodiment of the present invention.

FIG. 6 illustrates exemplary threshold detection and limiting circuitry 68 according to preferred embodiment. As illustrated, the threshold detection and limiting circuitry 68 is capable of providing one or more of the control signals discussed above and includes four series Schottky diodes 72A–72D. The anode of diode 72A is coupled to the output of the bias network 66 for the third stage 58 at an input of resistor 64. If each diode has a forward bias voltage of 0.6 volts, the series of diodes 72A–72D will conduct when the output of the bias network 66 surpasses 2.4 volts, which corresponds to an overload condition in this example. In essence, the current provided by the bias network 66 to the transistor 60 of the third stage 58 creates a voltage drop across resistor 64. When the base-emitter voltage (Vbe) of transistor 60 and the voltage drop across resistor 64 are greater than the threshold voltage, 2.4 volts, the diodes become forward biased. When diode 72A conducts, the anode voltage exceeds the voltage necessary to turn on transistor 76. By turning on transistor 76, current will flow through optional resistor 78 to provide a current proportional to the amount of the overload condition. Further, the current through the series diodes 72A–72D may further reduce the drive available to transistor 60 of the third stage 58.

In essence, a voltage divider is provided at the (base) resistor 64 of the third stage. The diodes 72A–72D effectively remove the threshold detection and limiting circuitry 68 from the design until the bias current is increased in an attempt to provide sufficient drive for an overload condition. Instead of potentially driving the third stage 58 to failure, the overload condition is detected and appropriate action is taken to reduce the drive at preceding stages. Optional signal condition circuitry 80 may be provided to condition the signal to be compatible with the bias network(s) 66. For the first embodiment, the collector of transistor 76 could be directly coupled or combined with resistor 70. As such, transistor 76 will turn on during overload conditions and shunt at least a portion of the bias and the RF input 50 to ground. Alternatively, the output of transistor 76 may be coupled to one or more of the bias networks 66, either directly or indirectly via the signal conditioning circuitry 80.

Although the series diodes 72A–72D are used to set a threshold, those skilled in the art will recognize other divider and detection configurations are readily available. The configuration of FIG. 6 provides an elegant and low power solution, especially when there is no overload. Those skilled in the art will recognize improvements and modifications to the preferred embodiments of the present invention. All such improvements and modifications are considered within the scope of the concepts disclosed herein and the claims that follow.

What is claimed is:

1. Amplifier and protection circuitry comprising:
   a) an amplifier having an output stage and an input stage for sequentially amplifying an input signal to provide an output signal;
   b) bias circuitry for providing bias to the output stage; and
   c) threshold detection and limiting circuitry adapted to detect an overload condition in the bias circuitry and provide an overload signal to reduce drive at the input stage to remove the overload at the output stage.

2. The amplifier and protection circuitry of claim 1 wherein:
   a) the input stage comprises at least one transistor receiving bias from the bias circuitry via at least one base resistor, and
   b) the threshold detection and limiting circuitry is coupled to the at least one base resistor opposite the transistor network so that bias provided through the at least one base resistor creates a voltage detectable by the threshold detection and limiting circuitry.

3. The amplifier and protection circuitry of claim 2 wherein the threshold detection and limiting circuitry is adapted to detect an overload when the voltage exceeds a defined threshold voltage.

4. The amplifier and protection circuitry of claim 3 wherein the threshold detection and limiting circuitry comprises voltage divider circuitry cooperating with the resistor to set the defined threshold voltage and turn on an overload signal transistor to generate the overload signal.

5. The amplifier and protection circuitry of claim 4 wherein the voltage divider comprises a series of diodes having a total forward bias threshold corresponding to the defined threshold voltage.

6. The amplifier and protection circuitry of claim 5 wherein the overload signal transistor is coupled to the series of diodes and is adapted to turn on when current flows through the series of diodes during overload.

7. The amplifier and protection circuitry of claim 1 wherein the overload signal of the threshold detection and limiting circuitry is applied to the input stage to shunt away at least a portion of at least one of the group consisting of bias for the input stage and the input signal.

8. The amplifier and protection circuitry of claim 1 wherein the input stage is associated with bias circuitry, which is coupled to the threshold detection and limiting circuitry and responsive to the overload signal to reduce bias applied to the input stage.

9. The amplifier and protection circuitry of claim 8 wherein the bias circuitry for the output stage is coupled to the threshold detection and limiting circuitry and responsive to the overload signal to reduce bias applied to the output stage.

10. The amplifier and protection circuitry of claim 1 further comprising conditioning circuitry coupled to the threshold detection and limiting circuitry to condition the overload signal to facilitate drive reduction at the input stage to remove the overload at the output stage.

11. Amplifier protection circuitry comprising:
   a) means for detecting an overload condition in an output stage of an amplifier from within bias circuitry for the output stage;
   b) means for generating an overload signal responsive to the overload condition; and
   c) means for reducing drive at an input stage responsive to the overload signal.

12. The amplifier protection circuitry of claim 11 wherein the means for reducing the drive at the input stage shunts away at least a portion of at least one of the group consisting of bias for the input stage and an input signal.

13. The amplifier protection circuitry of claim 11 wherein the means for reducing the drive at the input stage includes bias circuitry associated with the input stage and responsive to the overload signal to reduce bias applied to the input stage.

14. The amplifier protection circuitry of claim 13 wherein the means for reducing the drive at the input stage includes bias circuitry associated with the output stage and responsive to the overload signal to reduce bias applied to the output stage.

15. A method for providing amplifier protection:
   a) detecting an overload condition in an output stage of an amplifier from within bias circuitry for the output stage;
   b) generating an overload signal responsive to the overload condition; and
   c) reducing drive at an input stage responsive to the overload signal.

16. The method of claim 15 wherein reducing the drive at the input stage shunts away at least a portion of at least one of the group consisting of bias for the input stage and an input signal.

17. The method of claim 15 wherein reducing the drive at the input stage reduces the bias applied to the input stage.

18. The amplifier protection circuitry of claim 17 further comprising reducing the bias applied to the output stage.

19. Amplifier protection circuitry for an amplifier having an output stage and an input stage for sequentially amplifying an input signal to provide an output signal and associated with bias circuitry for providing bias to the output stage, the amplifier protection circuitry comprising threshold detection and limiting circuitry adapted to detect an overload condition in the bias circuitry and provide an overload signal to reduce drive at the input stage to remove the overload at the output stage.

20. The amplifier protection circuitry of claim 19 wherein the input stage comprises at least one transistor receiving bias from the bias circuitry via at least one base resistor and the threshold detection and limiting circuitry is coupled to the at least one base resistor opposite the transistor network so that bias provided through the at least one base resistor creates a voltage detectable by the threshold detection and limiting circuitry.

21. The amplifier protection circuitry of claim 20 wherein the threshold detection and limiting circuitry is adapted to detect an overload when the voltage exceeds a defined threshold voltage.

22. The amplifier and protection circuitry of claim 21 wherein the threshold detection and limiting circuitry comprises voltage divider circuitry cooperating with the resistor to set the defined threshold voltage and turn on an overload signal transistor to generate the overload signal.

23. The amplifier and protection circuitry of claim 22 wherein the voltage divider comprises a series of diodes having a total forward bias threshold corresponding to the defined threshold voltage.

24. The amplifier and protection circuitry of claim 23 wherein the overload signal transistor is coupled to the series of diodes and is adapted to turn on when current flows through the series of diodes during overload.

* * * * *